United States Patent
Lee et al.

(10) Patent No.: US 10,015,884 B2
(45) Date of Patent: Jul. 3, 2018

(54) PRINTED CIRCUIT BOARD INCLUDING EMBEDDED ELECTRONIC COMPONENT AND METHOD FOR MANUFACTURING THE SAME

(71) Applicant: SAMSUNG ELECTRO-MECHANICS CO., LTD., Suwon (KR)

(72) Inventors: Seung Eun Lee, Sungnam (KR); Yee Na Shin, Suwon (KR); Yul Kyo Chung, Yongin (KR); Doo Hwan Lee, Daejeon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 776 days.

(21) Appl. No.: 14/073,206

(22) Filed: Nov. 6, 2013

(65) Prior Publication Data

US 2014/0182911 A1    Jul. 3, 2014

(30) Foreign Application Priority Data

Dec. 27, 2012   (KR) .................. 10-2012-0155031

(51) Int. Cl.
*H05K 1/11*       (2006.01)
*H01G 4/228*      (2006.01)
(Continued)

(52) U.S. Cl.
CPC ............ *H05K 1/185* (2013.01); *H01L 21/568* (2013.01); *H01L 2224/04105* (2013.01);
(Continued)

(58) Field of Classification Search
CPC ............ H05K 1/183; H05K 2203/0307; H01L 2924/15153; H01G 2/06; H01G 4/228
(Continued)

(56) References Cited

U.S. PATENT DOCUMENTS

| 6,809,268 B2 * | 10/2004 | Hayashi | H01L 23/49894 257/E23.077 |
| 2006/0263936 A1 * | 11/2006 | Hsu | H01L 23/5387 257/E23.127 |
| 2010/0212946 A1 * | 8/2010 | Shimizu | H01L 23/5389 174/260 |

FOREIGN PATENT DOCUMENTS

| JP | 2001-332437 A | 11/2001 |
| JP | 2002-100875 A | 4/2002 |

(Continued)

OTHER PUBLICATIONS

Yahashi (JP 2001-332437; English Machine Translation).*
(Continued)

*Primary Examiner* — Chau N Nguyen
*Assistant Examiner* — Roshn Varghese
(74) *Attorney, Agent, or Firm* — NSIP Law

(57) ABSTRACT

Disclosed herein is a printed circuit board (PCB) including an embedded electronic component, including: a core having a cavity; an electronic component inserted into the cavity having a rough surface formed on surfaces of external electrodes provided on both lateral portions thereof, a low rough surface being formed in a portion of the rough surfaces; insulating layers laminated on upper and lower portions of the core and bonded to an outer circumferential surface of the electronic component insertedly positioned in the cavity; and an external circuit pattern provided on the insulating layers.

7 Claims, 3 Drawing Sheets

(51) Int. Cl.
*H05K 1/18* (2006.01)
*H05K 3/46* (2006.01)
*H01L 21/56* (2006.01)

(52) U.S. Cl.
CPC ............. *H01L 2224/2518* (2013.01); *H01L 2224/8203* (2013.01); *H01L 2924/3512* (2013.01); *H05K 3/4644* (2013.01); *H05K 3/4697* (2013.01); *H05K 2201/10015* (2013.01); *H05K 2203/1469* (2013.01); *Y10T 29/4913* (2015.01)

(58) Field of Classification Search
USPC .................................................. 361/763, 764
See application file for complete search history.

(56) References Cited

FOREIGN PATENT DOCUMENTS

| | | |
|---|---|---|
| JP | 2005-109206 | 4/2005 |
| JP | 2005-243835 | 9/2005 |
| JP | 2006-228833 A | 8/2006 |
| JP | 2011-216740 | 10/2011 |
| JP | 2011-238923 A | 11/2011 |
| JP | 4840508 B2 | 12/2011 |
| JP | 2012-19247 | 1/2012 |
| JP | 2012-160500 | 8/2012 |
| KR | 2002-111219 | 4/2002 |
| KR | 10-2011-0100992 | 9/2011 |
| TW | 200830968 | 7/2008 |
| WO | WO 2007/142352 A1 | 12/2007 |

OTHER PUBLICATIONS

Yahashi (JP 2001-332437; English Machine Translation alternative version).*
Noda (JP 2012-019247; English Machine Translation).*
Taiwanese Office Action dated Nov. 6, 2014 in corresponding Taiwanese Patent Application No. 102136159.
Korean Office Action dated Nov. 29, 2013 in corresponding Korean Patent Application No. 10-2012-0155031.
Japanese Office Action dated May 20, 2014 in corresponding Japanese Patent Application No. 2013-218117.
Japanese Office Action dated Jul. 11, 2017, in corresponding to Japanese Application No. 2015-134194 (1 page in English, 3 pages in Japanese).
Japanese Office Action dated Apr. 28, 2015 in counterpart Japanese Patent Application No. 2014-185127 (5 pages, with partial English translation).

* cited by examiner

[FIG. 1]
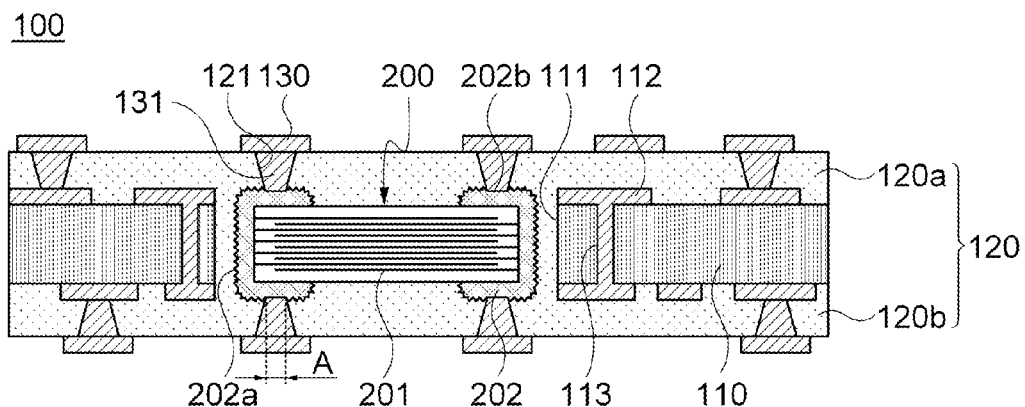
[FIG. 2A]
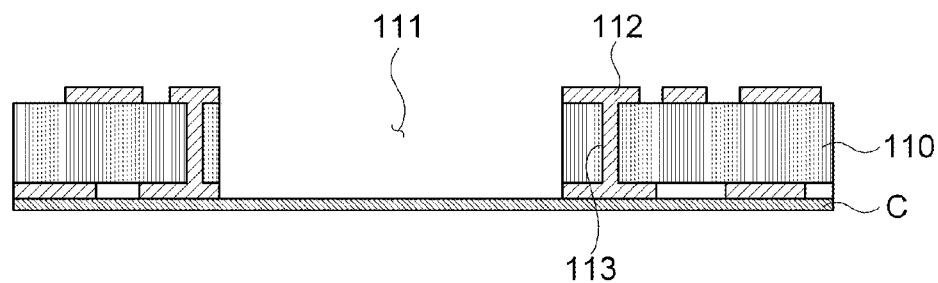
[FIG. 2B]
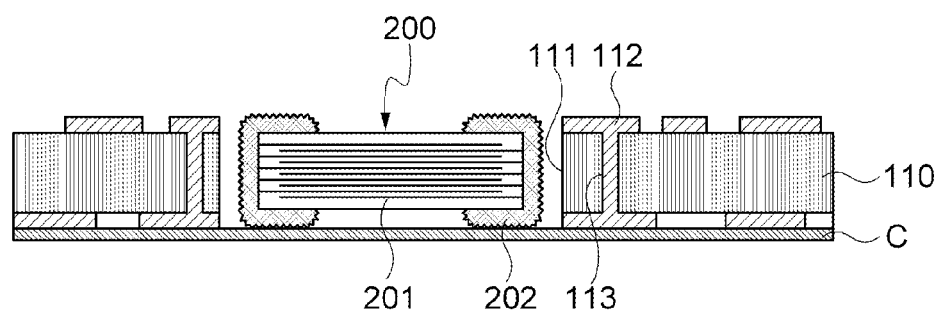

[FIG. 2C]
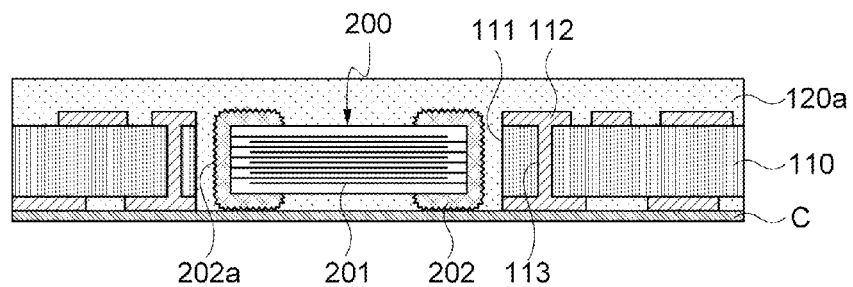
[FIG. 2D]
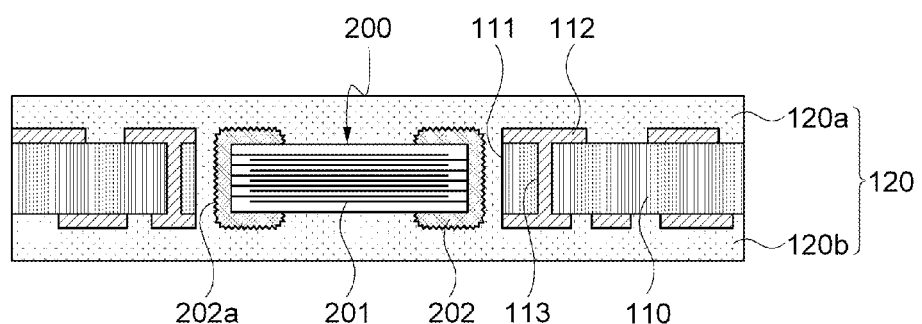
[FIG. 2E]
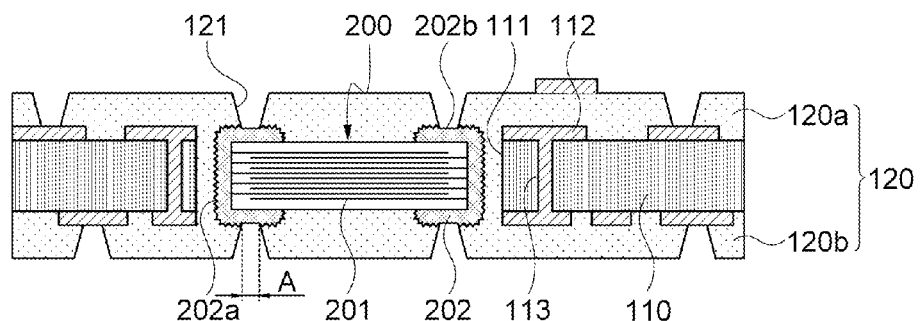

[FIG. 2F]
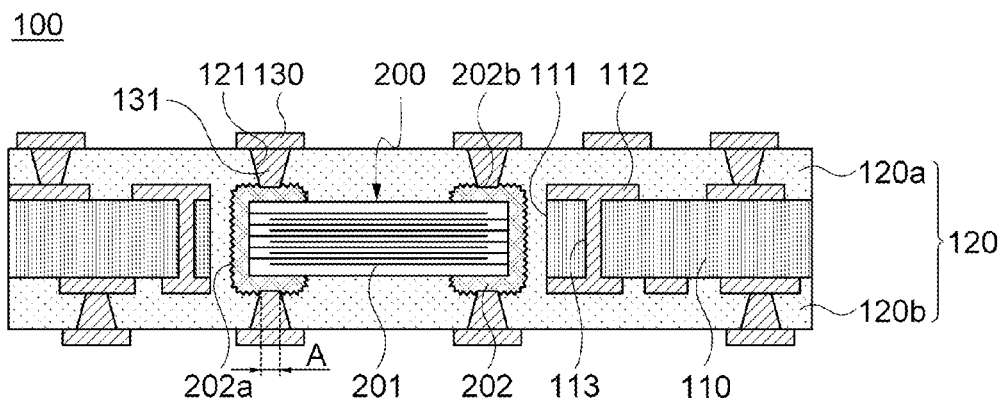

PRINTED CIRCUIT BOARD INCLUDING EMBEDDED ELECTRONIC COMPONENT AND METHOD FOR MANUFACTURING THE SAME

CROSS REFERENCE(S) TO RELATED APPLICATIONS

This application claims the benefit under 35 U.S.C. Section 119 of Korean Patent Application Serial No. 10-2012-0155031, entitled "Printed Circuit Board Including Embedded Electronic Component and Method for Manufacturing The Same" filed on Dec. 27, 2012, which is hereby incorporated by reference in its entirety into this application.

BACKGROUND OF THE INVENTION

1. Technical Field

The present invention relates to a printed circuit board (PCB) including an embedded electronic component and a method for manufacturing the same.

2. Description of the Related Art

As electronic devices including cellular phones in the information technology field have become lighter, thinner, shorter, and smaller, boards are limited in size, and as electronic devices are required to have multifunctionality, boards are required to allow more electronic components to be mounted thereon to implement a variety of functions in a limited area.

However, the limitation in size of boards makes it impossible to sufficiently secure an area for mounting electronic components, so a technique for embedding electronic components such as an active element, a passive element, or the like, such as an integrated chip (IC), a semiconductor chip, or the like, in boards is required. Recently, a technique of embedding an active element and a passive element in the same layer or embedding such elements in a laminated manner has been developed.

In general, in a method for manufacturing a printed circuit board (PCB) including an embedded component, a cavity is formed in a core of a board, and an electronic component, such as various elements, an IC, a semiconductor chip, and the like, is inserted into the cavity. Thereafter, a resin material such as prepreg, or the like, is applied to the interior of the cavity and the core in which the electronic component is insertedly positioned, to fix the electronic component and form an insulating layer, a via hole or a through hole is formed in the insulating layer, and circuits are formed through plating to allow the electronic component to be electrically connected to the outside of the board.

Here, circuit patterns are formed within the via hole or the through hole and an upper portion thereof through plating so as to be electrically connected to the electronic component embedded in the board, and insulating layers are sequentially laminated on upper and lower surfaces of the board to manufacture a multilayer PCB including the embedded electronic component.

In the related art PCB including the embedded component, in order to enhance bonding performance with respect to an insulating material covering an outer circumferential surface of the electronic component installed in the core, the outer circumferential surface including an external electrode of the electronic component are formed to have an uneven portion (or an irregular portion or a rough portion).

However, since the external electrode in a via hole formation region for an electrical connection between the electronic component and an external circuit pattern also has an uneven portion, a via crack phenomenon in which a via filling the interior of the via hole and the external electrode are separated occurs.

Also, in the related art PCB including an embedded component, when a via hole is formed by using a laser, the via hole may be defective due to scattered reflection, and when a seed layer is plated within the via hole, a thickness of the plated seed layer may be uneven. In addition, when de-smearing or pickling is performed, a processing solution is not removed, which causes a pudding phenomenon, or the like.

RELATED ART DOCUMENT (Patent Document 1) Japanese Patent Laid-Open Publication No. 2002-111219

SUMMARY OF THE INVENTION

An object of the present invention is to provide a printed circuit board including an embedded electronic component in which bonding reliability of an external electrode of an embedded electronic component and a via filling a via hole is enhanced.

Another object of the present invention is to provide a method for manufacturing a printed circuit board including an embedded electronic component in which bonding reliability of an external electrode of an embedded electronic component and a via filling a via hole is enhanced.

According to an embodiment of the present invention, there is provided a printed circuit board (PCB) including an embedded electronic component, including: a core having a cavity; an electronic component inserted into the cavity having a rough surface formed on surfaces of external electrodes provided on both lateral portions thereof, a low rough surface being formed in a portion of the rough surfaces; insulating layers laminated on upper and lower portions of the core and bonded to an outer circumferential surface of the electronic component insertedly positioned in the cavity; and an external circuit pattern provided on the insulating layers.

The insulating layers may further include via holes electrically connecting the outer circuit pattern to the external electrodes, and fill a space between the cavity and the electronic component.

The core may have circuit layers having a predetermined pattern formed on upper and lower surfaces thereof, and the upper and lower circuit layers of the core may be electrically connected through a through hole.

The low rough surface may be a via formation region connected to a lower portion of the via hole formed in the insulating layer, and the rough surface of the external electrode may have surface roughness ranging from 0.05 μm to 1 μm, and the low rough surface of the external electrode may have surface roughness equal to or less than 0.03 μm.

According to another embodiment of the present invention, there is provided a method for manufacturing a printed circuit board (PCB) including an embedded electronic component, including: forming a cavity as a through hole in a core and attaching a carrier to a lower surface of the core; inserting an electronic component, which has external electrodes formed on both lateral portions thereof and has a rough surface formed on a surface of the external electrodes and a low rough surface formed on a portion of the rough surface, into the cavity; forming insulating layers on an upper portion of the core having the electronic component embedded therein; removing the carrier attached to the lower surface of the core; forming another insulating layer on a surface opposite the surface of the core on which the insulating layer is formed; and forming an external circuit pattern electrically connected to the electronic component through via holes formed in the insulating layers formed on upper and lower portions of the core.

BRIEF DESCRIPTION OF THE DRAWINGS

FIG. 1 is a cross-sectional view of a printed circuit board (PCB) including an embedded electronic component according to an embodiment of the present invention.

FIGS. 2A-2F are views sequentially showing a process of manufacturing a PCB including an embedded electronic component according to an embodiment of the present invention.

DESCRIPTION OF THE PREFERRED EMBODIMENTS

The acting effects and technical configuration with respect to the objects of a printed circuit board (PCB) including an embedded electronic component and a method for manufacturing the same according to the present invention will be clearly understood by the following description in which exemplary embodiments of the present invention are described with reference to the accompanying drawings.

Printed Circuit Board (PCB) Including Embedded Electronic Component

First, FIG. 1 is a cross-sectional view of a printed circuit board (PCB) including an embedded electronic component according to an embodiment of the present invention.

As illustrated, in a PCB 100 including an embedded electronic component, an electronic component 200 is installed in a core 110 having a cavity 111 formed therein, insulating layers 120 are laminated on upper and lower portions of the core 110, a rough surface 202a having roughness Ra is formed on an outer circumferential surface of the electronic component 200 embedded in the core 110, and a via formation region of the rough surface 202a has a low rough surface 202b.

The PCB 100 including an embedded electronic component is illustrated to have an electronic component 200 embedded in a single position, but the present invention is not limited thereto and electronic components may be embedded at predetermined intervals in every PCB of a unit, and one or more electronic components 200 may be installed according to types thereof.

The cavity 111 may be formed as a through hole in the core 110, and in this case, the cavity 111 may be formed through laser machining or drilling using CNC. Here, the cavity 111 may have a width equal to or greater than that of the electronic component 200 installed therein.

Also, circuit layers 112 having a predetermined pattern may be formed on upper and lower surfaces of the core 110, respectively. The respective circuit layers 110 may be electrically connected through via holes or through holes 113 penetrating the core 110. Here, the core 110 may be made of an insulating material, and in order to enhance heat dissipation efficiency of the board, the core 110 may be made of metal such as aluminum, or the like. In case that the core is made of metal, an insulating layer for preventing a short-circuit or an oxidation insulating layer using an anodizing process may be further formed before the formation of the circuit layer.

Meanwhile, the electronic component 200 is inserted in the cavity 111 of the core 110. The electronic component 200 may be a passive element such as an MLCC, an LTCC, a chip resistor, or an active element such as an IC, a semiconductor chip, a CPU, or the like. Here, the electronic component 200 may be formed to be higher than the core 110, but preferably, it may be formed to have the same height as that of the core 110 in consideration of a thickness of the insulating layers 120 formed on upper and lower portions of the core 110.

Here, as the electronic component 200, a typical MLCC, a passive element, having a shape as shown in the drawings will be described as an example. The electronic component 200 may include a body 201 including a plurality of internal electrodes formed therein and positive and negative external electrodes 202 formed on both lateral portions of the body 201. The both external electrodes 202 may be physically and electrically connected to external circuit patterns 130 through via holes 121 formed in the respective insulating layers 120.

The insulating layers 120 may be laminated on upper and lower surfaces of the core 110 in which the electronic component 200 is embedded, respectively. The insulating layer 120 may be made of an insulating material such as prepreg (PPG), or the like, and the via hole 121 may be formed to electrically connect the circuit layers 112 formed on upper and lower surfaces of the core 110 and the external circuit pattern 130 formed on the insulating layer 120. In this case, the via hole 121 may be connected to the external electrode 202 of the electronic component 200 embedded in the core 110, so the external electrode 202 of the electronic component 200 may be electrically connected to the external circuit pattern 130 through the via hole 121. Here, a region of the external electrode 202 of the electronic component 200 to which a lower portion the via hole 121 is connected is defined as a via formation region 'A'.

A rough surface 202a may be formed on an outer circumferential surface of the electronic component 200. The rough surface 202a formed on the outer circumferential surface of the electronic component 200 may be formed on surfaces of the external electrodes 202, as well as on upper and lower surfaces of the body 201 exposed between the external electrodes 202. Also, the rough surface 202a may be formed only on the surface of the external electrodes 202, excluding the upper and lower surfaces of the electronic component 200.

Meanwhile, the via formation region A, a region to which a lower portion of the via hole 121 formed on the insulating layer 120 is connected, included in the rough surface 202a formed on the outer circumferential surface of the electronic component 200 may be formed as the low rough surface 202b.

The low rough surface 202b of the external electrode 202 of the electronic component 200 may be formed as a relatively flat surface, in comparison to the rough surface 202a, and roughness Ra of the rough surface 202a may range from 0.05 μm to 1 μm and, preferably, roughness Ra of the low rough surface 202b is equal to or less than 0.05 μm. In addition, since it is impossible to form the low roughness surface 202b as a flat surface having zero roughness, i.e., without roughness Ra, in terms of the characteristics of the external electrode 202, so it is natural that a lower limit of the low rough surface 202b is more than 0.

Thus, since a contact area between the rough surface 202a of the external electrode 202 and the insulating layer 120 is increased due to the relatively large surface roughness Ra within the surface roughness Ra range of the external electrode 202 of the electronic component 200 configured as described above, bonding reliability can be enhanced. Also, the low roughness surface 202b formed on the external electrode 202 is formed as a relatively flat surface in comparison to the rough surface 202a, bonding performance with respect to the via 131 filling the interior of the via hole 121 of the insulating layer 120 is enhanced to prevent a defective connection such as via cracks, or the like.

In the PCB 100 including an embedded electronic component configured as described, when the electronic component 200 inserted into the interior of the core 110 having the cavity 111 is manufactured, the rough source 202a may be formed by increasing metal powder in pickling or oxidizing the surface of the electronic component 200 or doping the external electrode 202, and after the electronic component 200 having the rough surface 202a formed on the external electrode 202 or the entire surface thereof is inserted into the core 110, the low rough surface 202b may be formed on the via formation region A of the external electrode 202 through a separate process. A specific manufacturing method thereof will be described with reference to a drawing illustrating a process of manufacturing the PCB including an embedded electronic component below.

The insulating layers 120 may be formed on upper and lower portions of the core 110 in which the electronic component 200 is embedded. The insulating layers 120 may be formed by laminating an insulating material, i.e., an insulating resin material such as prepreg, and curing the same, and when the insulating layers 120 are laminated and cured, a resin may be introduced to the internal space of the cavity 111 in both sides of the electronic component 200 to fix the position of the electronic component 200.

A plurality of via holes 121 may be formed in the insulating layers 120. Like the cavity 111 formed in the core 110, the via holes 121 may be formed by laser machining or drilling using CNC. After the formation of the via holes 121, a via may be formed on an upper surface of the insulating layer 120 including the via holes 121, and etched to form the circuit pattern 130 electrically connected to the electronic component 200.

Method for Manufacturing PCB Including Embedded Electronic Component

A method for manufacturing a PCB including an embedded electronic component configured as described above will be described with reference to the accompanying drawing as follows.

FIGS. 2A-2F are views sequentially showing a process of manufacturing a PCB including an embedded electronic component according to an embodiment of the present invention.

First, as illustrated in FIG. 2A, the cavity 111 is formed as a through hole in the core 110 made of an insulating material. The cavity 111 may be formed through laser machining or drilling. The cavity 111 may be formed to have a predetermined size and, in this case, the cavity 111 may have a size equal to or greater than a width of the electronic component 200 inserted therein.

In addition, a carrier C may be attached to a lower surface of the core 110. The carrier C is a member for fixing the position of the electronic component 200 when the electronic component 200 is inserted into the cavity 111 configured as a through hole. The carrier C serves to prevent the electronic component 200 from being released from the cavity 111 and an adhesive member may be applied to an upper surface of the carrier C to temporarily fix the electronic component 200.

Next, as illustrated in FIG. 2B, the electronic component 200 is inserted into the cavity 111 of the core 110 so as to be positioned on the carrier C. The electronic component 200 having the same height as a thickness of the core 110 may be inserted, and if the height of the electronic component 200 is higher, the thickness of the core 110 may be greater to be level with the electronic component 200.

Meanwhile, before the electronic component 200 is inserted into the core 110, the rough surface 202a having predetermined surface roughness Ra may be formed on an outer circumferential surface of the electronic component 200 or on the surface of the external electrode 202 formed on the electronic component 200. Here, the surface roughness Ra of the rough surface 202a may range from 0.05 μm to 1 μm. If the rough surface 202a has surface roughness Ra less than 0.05 μm, bonding reliability with the insulating layer 120 bonded to the outer circumferential surface of the electronic component 200 may be degraded, and if the rough surface 202a has surface roughness Ra more than 1 μm, bonding reliability with respect to the insulating layer 120 may be maintained but in processing via holes, laser scattered reflection is made from the rough surface of the external electrode, resulting in defective processing of via holes having an irregular shape rather than having a uniform size and generation of voids on the bonding surface with the external electrode 202 when the insulating layer 120 is laminated.

Here, the rough surface 202a may be formed on the external electrode 202 of the electronic component 200 illustrated in FIG. 2B through three types of methods. According to a first method, a surface of the external electrode 202 of the electronic component 200 may be pickled to have surface roughness Ra ranging from 0.05 μm to 1 μm. In pickling the external electrode 202, a surface of the external electrode may etched by a pickling solution to provide roughness. According to a second method, a surface of the external electrode 202 of the electronic component 200 may be oxidized to provide surface roughness Ra ranging from 0.05 μm to 1 μm. The oxidation of the external electrode 202 may be achieved by exposing the external electrode to an oxidation solution or an oxidation atmosphere to form an oxide film having roughness on a surface of the external electrode 202. According to a third method, in forming the external electrode 202 of the electronic component 200, the content of metal powder in a paste for forming the external electrode is increased to obtain surface rough Ra ranging from 0.05 μm to 1 μm. In manufacturing a paste containing copper (Cu) as a main ingredient for forming the external electrode 202, the content of copper (Cu) metal powder is adjusted to range from 30 wt % to 80 wt % to form the external electrode 202, thus increasing the surface roughness Ra.

Thereafter, as illustrated in FIG. 2C, the upper insulating layer 120a is formed in an upper portion of the core 110 having the electronic component 200 embedded therein. The upper insulating layer 120a may be formed by laminating an insulating material, and in this case, the insulating material may be cured through heating and compressing. When the insulating material is heated and compressed, a portion of the insulating material may be introduced to a space between the cavity 111 of the core 110 and the electronic component 200 and cured, fixing the electronic component 200. Alternatively, before the formation of the upper insulating layer 120a, an adhesive may be injected between the electronic component 200 and a side wall of the cavity 111 to fix the electronic component 200.

When the lamination of the upper insulating layer 120a is completed, the carrier C attached to the lower surface of the core 110 is removed. Thereafter, as illustrated in FIG. 2D, the core 110 is reversed and the lower insulating layer 120b is laminated on a surface opposite the surface of the core 110 on which the upper insulating layer 120a is formed, in the same manner as that of the upper insulating layer 120a and cured through heating and compressing to complete the formation of the insulating layers 120 as illustrated in FIG. 2D.

Thereafter, as illustrated in FIG. 2E, the via holes 121 may be formed on upper and lower insulating layers. The via holes 121 may be formed by laser machining or mechanical machining using CNC, and may be formed to be connected to the circuit layer 112 formed on the core 110 and the surface of the external electrode 202 of the electronic component 200 installed in the core 110 according to the design a circuit pattern of the PCB including the embedded electronic component.

In the case of forming a via within the via hole 121 after the via hole 121 is formed in the insulating layer 120 as illustrated in FIG. 2E, when the via filling the via hole 121 is bonded to the rough surface 202a formed on the external electrode 202 of the electronic component 200, via cracks may occur between the via and the rough surface 202a due to the relatively high roughness Ra of the rough surface 202a, and when a de-smearing process is performed before the formation of the via, a pudding phenomenon, or the like, may be generated on the rough surface 202a to increase crack generation. Thus, a planarization process may be required to be further performed on the rough surface 202a.

Thus, as illustrated in FIG. 2E, a lower surface of the via hole 121 formed in the insulating layer 120, i.e., the via formation region 'A' of the external electrode 202 of the electronic component 200, is preferably formed as a low rough surface 202b having surface roughness Ra equal to or less than 0.05 µm.

The low rough surface 202b of the external electrode 202 of the electronic component 200 may be formed by planarizing a rough surface by using a laser or through electrolytic polishing, and the via formation region 'A' may be formed through etching. Also, the low rough surface 202b may be formed through mechanical polishing using sand blast.

Among them, as for the formation of the low rough surface 202b of the via formation region 'A' using electrolytic polishing, the via hole 121 is formed in the insulating layer 120, a lower surface of the via hole 121 is first plated and subsequently undergoes an electrolytic polishing process. Then, a via is formed on the lower surface of the via hole and even the external electrode 202 of the electronic component 200 is also electrolytically polished to planarize the via formation region 'A' of the external electrode 202. Here, even a surface of the circuit layer 112 formed on the core 110, as well as the external electrode 202 of the electronic component 200, may also be electrolytically polished, bonding reliability between the via hole 121 the surface of the external electrode 202 or between the via hole 121 and the circuit pattern of the circuit layer 112 can be simultaneously enhanced.

Finally, as illustrated in FIG. 2F, the via is formed within the via hole 121 formed in the insulating layer 120, and the external circuit pattern 130 is formed by etching the via 131, thus completing manufacturing of the PCB including an embedded electronic component.

Evaluation of Reliability of PCB Including Embedded Electronic Component

Sampling measurement of bonding reliability between the external electrode of the embedded electronic component of the PCB manufactured as illustrated in FIGS. 1 and 2A-2F and the via formation region formed through the foregoing manufacturing process shows that, in comparison to the case in which only a rough surface, without a low rough surface, is formed on the external electrode of the electronic component, when a PCB is manufactured with a low rough surface formed on the external electrode, bonding strength between the external electrode and the insulating layer was enhanced and a crack generation of the via hole and the via was prevented.

First, before evaluating bonding reliability of the PCB including the embedded electronic component, rough surfaces ranging from 0.05 µm to 2 µm were formed on the entire surfaces of the external electrodes of electronic components and embedded in the cavity 111 of the core 110, via holes were formed to have different sizes, and bonding reliability between vias filling the interiors of the via holes 121 and the external electrodes 202 of the electronic components was evaluated, results of which are as shown in Table 1 below.

TABLE 1

| Surface roughness (Ra) of external electrode | Via size (diameter) | Inspection of exterior | Defective cycle number over 500 times | Defective cycle number over 1000 times |
|---|---|---|---|---|
| 0.05 um to 1 um | 50 um | x | 6/2880 | 21/2880 |
| | 45 um | x | 10/2880 | 48/2880 |
| | 40 um | x | 7/2880 | 25/2880 |
| | 50 um | x | 20/2880 | 68/2880 |
| | 45 um | x | 22/2880 | 65/2880 |
| | 40 um | x | 17/2880 | 59/2880 |

In the results in Table 1, the rough surfaces were formed overall by performing etching based on pickling on the external electrodes of the electronic components, and the sizes of the roughness Ra were adjusted by adjusting a pickling duration.

As a result, it can be seen that, when the surface roughness of the external electrode of the electronic component was equal to or more than 0.05 µm, the size of the via hole was not sufficient and the via hole had a defective angle in inspecting the exterior of the via hole, and cracks were generated in the via filling the via hole and the surface of the external electrode in every case, regardless of the size of the via hole. In addition, it can be seen that, when the surface roughness Ra of the external electrode of the electronic component was equal to or more than 1 µm, the via crack generation frequency was severe.

Thereafter, in order to evaluate bonding reliability of the PCB including the embedded electronic component, rough surfaces ranging from 0.05 µm to 1 µm were formed on the external electrode of the electronic component, a low rough surface of 0.5 µm or less was formed in the via formation region 'A' connected to the via hole 121 formed in the insulating layer 120, and bonding reliability between the via within the via hole connected to the low rough surface and the via formation region A as a low rough surface was evaluated. Results thereof are shown in Table 2 below.

TABLE 2

| Via size (Diameter) | Inspection of exterior | Defective cycle number over 500 times | Defective cycle number over 1000 times |
|---|---|---|---|
| 50 um | 0 | 2/2880 | 7/2880 |
| 45 um | 0 | 0/2880 | 0/2880 |
| 40 um | 0 | 0/2880 | 0/2880 |

In the results of Table 2, the rough surfaces were formed overall by performing etching based on pickling on the external electrodes of the electronic components, the electronic component including the external electrode having the rough surface was embedded in the cavity 111 of the core 110, the via hole 121 was formed in the insulating layers laminated on upper and lower surfaces of the core 110, and the via formation region 'A' of the external electrode 202 was planarized as a low rough surface, and the via was formed within the via hole.

As shown in Table 2, it can be seen that, when the via formation region 'A' was formed as a low rough surface and the interior of the via hole was filled with a via, the inspection of the exterior of the via hole was good and delamination of the via in the contact interface between the via within the via hole and the external electrode was prevented.

As described above, in the case of the PCB having an embedded PCB and the manufacturing method thereof, since the rough surface is formed on the external electrodes of the electronic component embedded in the core constituting the PCB and a low rough surface is formed on the via formation region included in the rough surface, a contact area between the insulating layers and the external electrodes is increased, enhancing bonding reliability between the electronic component and the insulating layer.

Also, since the low rough surface formed in the via formation region of the external electrode is formed as a flat surface, relative to the rough surface, bonding performance between the via filling the interior of the via hole and the external electrode can be enhanced, preventing a defective connection such as via cracks, or the like.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A printed circuit board (PCB) including an embedded electronic component, the printed circuit board comprising:
a core having a cavity;
an electronic component inserted into the cavity and comprising external electrodes provided on one or more side portions thereof;
an insulating layer laminated on a surface of the core and bonded to an outer circumferential surface of the electronic component inserted in the cavity;
an external circuit pattern provided on the insulating layer; and
a via formed in the insulating layer,
wherein the external electrodes comprise a first rough surface and a second rough surface formed on surfaces thereof, the second rough surface having a lower surface roughness than the first rough surface,
wherein a concave part is formed at the external electrodes,
wherein a lower part of the via is inserted into the concave part, and
wherein the second rough surface is formed only at an interface between the lower portion of the via and the concave part.

2. The printed circuit board according to claim 1, wherein the electronic component comprises a multilayer ceramic capacitor (MLCC) comprising a body provided between the external electrodes.

3. The printed circuit board according to claim 1, wherein the via is configured to electrically connect the external circuit pattern to the external electrodes.

4. The printed circuit board according to claim 1, wherein the insulating layer fills a space between the cavity and the electronic component.

5. The printed circuit board according to claim 1, wherein the core has circuit layers having a predetermined pattern formed on upper and lower surfaces thereof, and the upper and lower circuit layers of the core are electrically connected through a through hole.

6. The printed circuit board according to claim 1, wherein the rough surface of the external electrode has surface roughness ranging from 0.05 μm to 1 μm.

7. The printed circuit board according to claim 1, wherein the second rough surface has surface roughness equal to or less than 0.03 μm.

* * * * *